United States Patent [19]

Farrar et al.

[11] Patent Number: 5,047,636

[45] Date of Patent: Sep. 10, 1991

[54] LINEAR PREDICTION ION CYCLOTRON RESONANCE SPECTROMETRY APPARATUS AND METHOD

[75] Inventors: Thomas C. Farrar; Jeffrey F. Loo; Mark D. Krahling; John W. Elling, all of Madison, Wis.

[73] Assignee: Wisconsin Alumni Research Foundation, Madison, Wis.

[21] Appl. No.: 462,161

[22] Filed: Jan. 8, 1990

[51] Int. Cl.$^5$ .................. B01D 59/44; H01J 49/00
[52] U.S. Cl. .................................. 250/291; 250/292
[58] Field of Search ............... 250/281, 282, 291, 292

[56] References Cited

U.S. PATENT DOCUMENTS

| 4,065,714 | 12/1977 | Hill | 324/314 |
| 4,397,955 | 2/1976 | Comisarow et al. | 250/283 |
| 4,855,593 | 8/1989 | Bodenhausen et al. | 250/282 |

OTHER PUBLICATIONS

"Estimating the Parameters of Exponentially Damped Sinusoids and Pole-Zero Modeling in Noise", *IEEE Transactions on Acoustics, Speech, and Signal Processing*, vol. ASSP-30, No. 6. 12/82.

"Retrieval of Frequencies, Amplitudes, Damping Factors and Phases from Time-Domain Signals Using a Linear Least-Squares Procedure", *Journal of Magnetic Resonance*, 61, 465, (1985) Barkhuijsen et al.

*Primary Examiner*—Bruce C. Anderson
*Attorney, Agent, or Firm*—Quarles & Brady

[57] ABSTRACT

A gaseous sample for mass spectroscopy analysis is introduced into an ion resonance cell within an evacuated chamber. An electron beam is passed through the cell to ionize the gas. A magnetic field is applied along a first direction within the cell and a static electric field is applied along a second direction orthogonal to the first direction. The combined action of the magnetic and static electric fields confine the ions and cause them to orbit. An alternating electric field is created within the cell to excite ions having mass-to-charge ratios within a predetermined range. A time domain signal produced by the excited ions is detected and digitized. The digital samples of the time domain electical signal are transformed into frequency domain data by linear prediction using a linear lest-squares procedure. The resultant frequency domain data contains information about the mass of the different types of ions present in the cell and the relative number of each type.

18 Claims, 3 Drawing Sheets

LINEAR PREDICTION ION CYCLOTRON RESONANCE SPECTROMETRY APPARATUS AND METHOD

BACKGROUND OF THE INVENTION

The present invention relates to ion cyclotron resonance spectroscopy.

Ion cyclotron resonance is a well known phenomenon and provides a sensitive and versatile means for detecting gaseous ions. According to this phenomenon, a gaseous ion moving in a static magnetic field is constrained to move in a circular orbit in a plane perpendicular to the direction of the magnetic field, and its movement is unrestrained in directions parallel to the magnetic field. The frequency of this circular motion is directly dependent upon the strength of the magnetic field and the mass-to-charge ratio of the ion. When such orbiting ions are subjected to an oscillating electric field disposed orthogonally to the magnetic field, those ions having an orbital frequency equal to the frequency of the oscillating electric field absorb energy from the electric field and are accelerated to larger orbital radii and higher kinetic energy levels.

This phenomenon has been used by ion cyclotron resonance mass spectrometers to detect different types of ions. An example of this type of mass spectrometer and its operation are described in U.S. Pat. No. 3,937,955. This device includes a single cell ion trap formed by a six-electrode cube mounted within a high-vacuum chamber. An electron gun directs a pulsed beam of electrons through the cell, which ionizes a sample of a gaseous material to the analyzed. The bias potential on two electrodes perpendicular to the magnetic field traps the charged ions within the cell.

An externally applied magnetic field causes the ions to move in circular orbits in planes that are perpendicular to the direction of the field. Each ion has an angular cyclotron frequency $\omega_c$ given by the equation:

$$\omega_c = (q/m)B \quad (1)$$

(q/m) is the mass-to-charge ratio of the ion, and B is the magnetic field strength. A typical sample being analyzed consists of several types of ions which orbit (cyclotron) at different frequencies due to their different mass-to-charge ratios.

Following the formation of ions, the cyclotron orbital radii is increased by applying a time-varying excitation potential to one or two opposed cell electrodes which are parallel to the magnetic field. This produces an electric field that excites the orbiting (cyclotroning) ions to higher kinetic energy. After the excitation pulse, the orbiting ions induce an alternating voltage across another pair of opposed electrodes which are positioned parallel to the magnetic field direction. This voltage has a frequency produced by the superposition of signals at each of the ion cyclotron resonant frequencies. The amplitude of each component signal is proportional to the number of ions having the corresponding mass-to-charge ratio. The composite signal produced by the excited ions typically is amplified, digitized and stored in a computer memory. Fourier analysis is employed to transform the composite signal in the time domain into a frequency domain signal containing information regarding the mass and relative abundance of each type of ion within the cell.

The ability of the conventional Fourier transform analysis ion cyclotron resonance spectroscopy in distinguishing between different ions having similar mass-to-charge ratios (i.e. closely separated resonant frequencies) is directly related to the period during which the time domain signal from the cell is sampled. For example, if two different ions resonate at frequencies which are one hertz apart, the cell's output signal will have to be sampled for one second or a hundred times longer than if the frequencies are separated by 100 hertz. The ability to resolve close resonant frequencies is important if the analysis is to detect different ions of the same nominal mass, for example.

However, as the composite signal sampling time increases, so do the artifacts in the signal due to inhomogeneities in the magnetic and electric fields within the ion trapping cell. Additionally, signals from different ions have different durations. Such artifacts can greatly affect the quantitative measurement of each type of ion in the sample. In other terms, the longer the required sampling period, the greater the inaccuracy in the data. As a consequence, it would be desirable to be able to perform a high resolution transformation of the composite signal from the time to frequency domains using a short signal sampling period during which the effects of the previously mentioned artifacts will be small.

SUMMARY OF THE INVENTION

A spectrometer according to the present invention includes an ion trapping cell within a evacuatable chamber. The cell is formed by a plurality of electrodes which define a given volume. In one embodiment, the cell is a parallelogram formed by six electrode plates with a pair of aligned apertures extending through two of the plates.

A filament and electrode screen are within the chamber to produce an electron beam when properly biased. The filament is positioned so that the electron beam passes through the electrode plate apertures, thereby traversing the volume of the cell. The electron beam strikes a collector on the remote side of the cell from the filament.

To operate the spectrometer, a gaseous sample to be analyzed is introduced into the chamber after evacuation. The filament, screen and collector are biased to emit electron beam pulses, which ionize the gaseous sample. A static magnetic field is applied through the chamber in a direction parallel to the electron beam. The interaction of the gas ions with the magnetic field causes the ions to orbit in planes perpendicular to the direction of the magnetic field. A voltage potential applied to the electrode plates orthogonal to the magnetic field direction confine the ions along that direction and the magnetic field confines the ions along the other two orthogonal directions.

Following ion generation, an time varying signal is applied between two opposed electrode plates which are in planes parallel to the magnetic field direction. This alternating signal excites the ions to oscillate in the cyclotron resonance mode at higher kinetic energy and in larger orbits within the cell.

The excited ions induce a voltage across the other pair of electrodes which are parallel to the magnetic field. This voltage is produced by the superposition of the resonant frequency signals from each group of oscillating ions having a unique mass-to-charge ratio. The detected voltage signal is digitized and the resultant signal samples are stored in a memory. If K represents the number of ion types with unique mass-to-charge ratios and hence the number of component frequencies in the signal received from the cell, at least 2 K signal samples should be taken. In practice, several times this number of signal samples must be taken in order to reduce the effects of signal noise on subsequent signal sample processing.

The signal samples representing the time-domain signal received from the ion cyclotron resonance cell are transformed to the frequency domain using a linear prediction technique. The linear prediction approach requires significantly fewer data samples than the Fourier transform method. Therefore, the signal received from the cell is sampled over a much shorter period during which the previously mentioned artifacts are relatively small.

The general object of the present invention is to perform ion cyclotron resonance analysis using data samples acquired in as short a period of time as possible.

A more specific object to utilize linear prediction to fit data samples into a mathematical model by a linear least-squares procedure.

Another object is to provide an alternative manner in which to excite the ions to improve the capability to distinguish among different groups of ions which resonant at relatively closely separated frequencies.

A further object is to provide a method of signal processing, which increases the accuracy of the quantitative analysis of the ions of different mass within the sample.

DETAILED DESCRIPTION OF THE INVENTION

Figure 1:
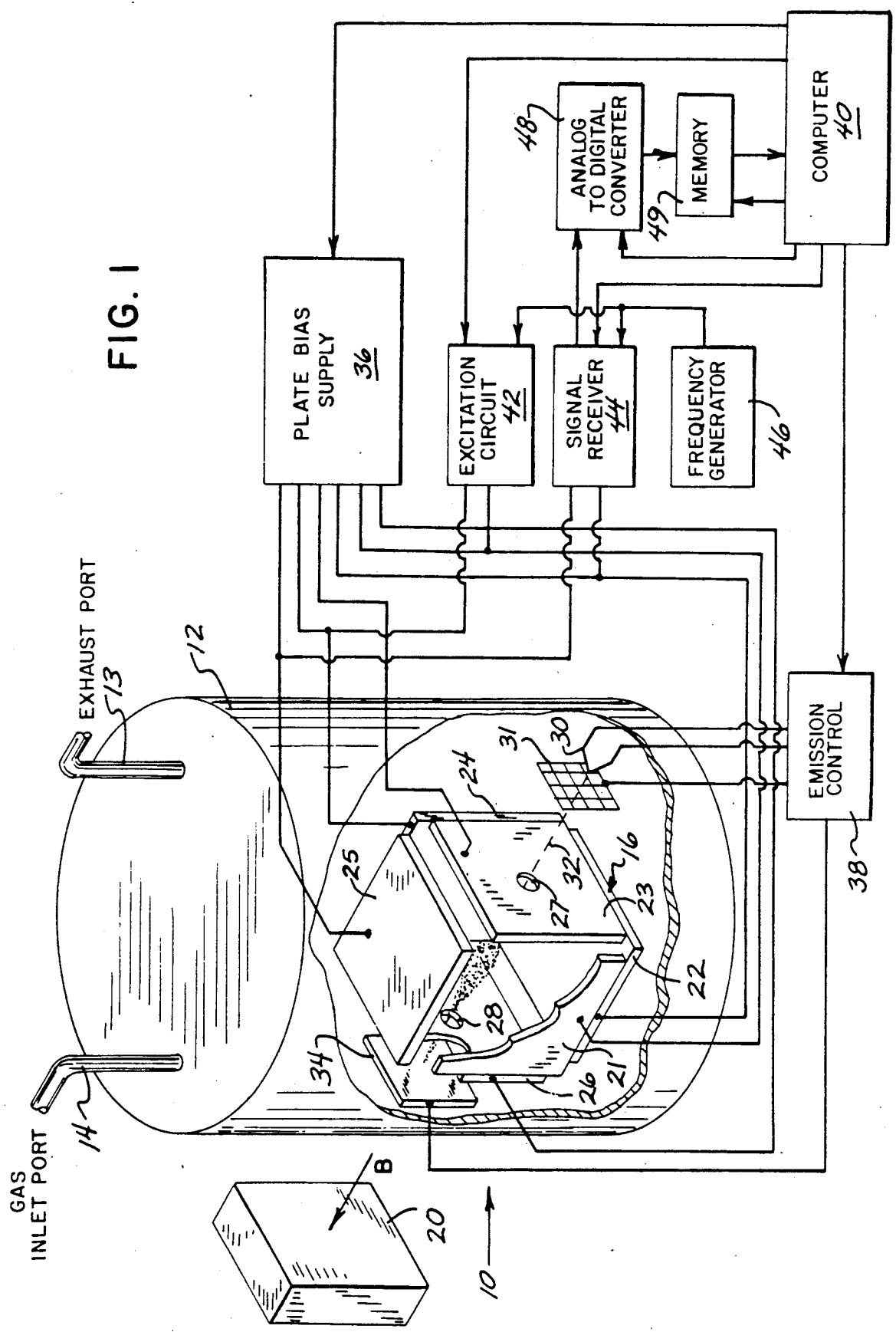
FIG. 1 is a diagram of an ion resonance cell, Control circuitry for producing and exciting ions within the cell, and circuitry for analyzing the output signal from the cell.

An embodiment of an ion cyclotron resonant spectrometer 10 according to the present invention is illustrated in FIG. 1. The apparatus includes a vacuum chamber 12 having an exhaust port 13 coupled to a conventional pumping system (not shown) and an inlet port 14 through which gas can be introduced into the chamber. An ion trapping cell 16 is positioned within the vacuum chamber 12. Although any of several well-known cell geometries may be used, the illustrated one is a parallelogram formed by six conductive electrode plates 21-26. Two opposed plates 23 and 26 have centrally located apertures 27 and 28 therethrough.

Also located within the vacuum chamber 12 is a filament 30 and a screen electrode 31 for the creation of a beam of electrons 32. The filament and screen electrodes are aligned so that the electron beam 32 passes through plate apertures 27 and 28, thereby traversing the cell 16. The electron beam 32 strikes a collector 34 on the remote side of the cell 16 from the filament 30.

A magnetic field generator, schematically illustrated as element 20, produces a magnetic field B passing through the cell 16 in a direction parallel to the direction of electron beam 32. Typically, the generator 20 comprises an electromagnet adjacent the exterior of vacuum chamber 12.

Figure 2:
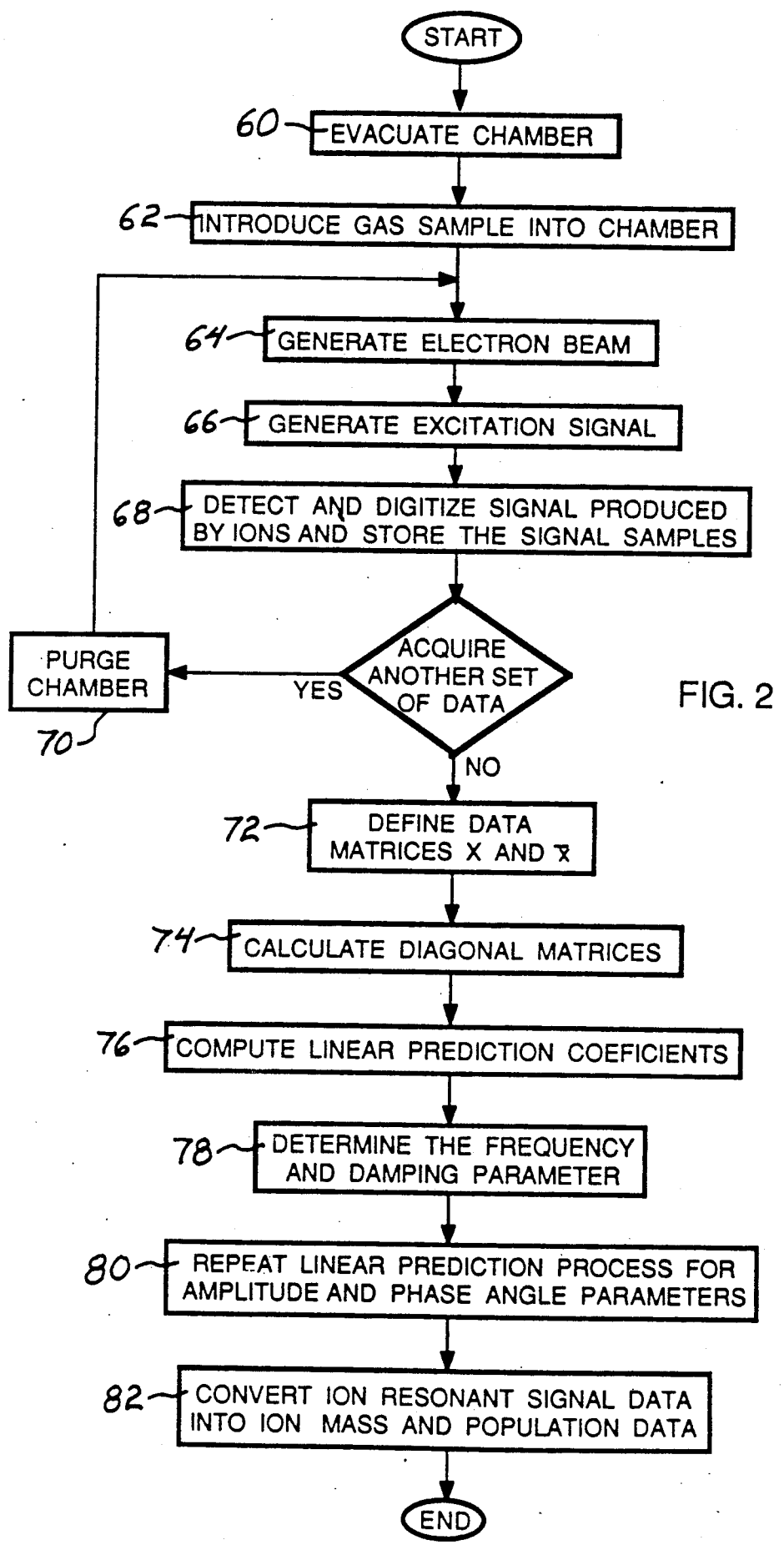
FIG. 2 is a flowchart of the operation of the spectroscopy system in FIG. 1.

The vacuum chamber 12 and ion cyclotron cell 16 can be operated in much the same manner as the device described in the aforementioned U.S. Patent. This operation will be summarized with reference to FIG. 1 and the flowchart of FIG. 2. Commencing at step 60, the chamber 12 is pumped down to approximately $10^{-9}$ torr, for example, and the gaseous sample to be analyzed is introduced into the chamber through inlet port 14 at step 62 until the pressure is in the range of $10^{-6}$ to $10^{-9}$ torr.

In response to a command from a computer 40, an emission control circuit 38 applies bias voltages to the filament 30, screen 31 and collector 34. This biasing generates a burst of electrons in a beam 32 flowing from the filament to the collector through apertures 27 and 28 of the cell electrode plates 23 and 26 at step 64. The gas sample within the cell 16 is ionized by the collision of the electrons with the gas atoms or molecules. Several electron beam pulses may be generated to insure adequate ionization of the gas sample.

A plate bias supply 36 applies static bias voltage to the six electrode plates 21-26 of cell 16. The magnetic field B constrains the movement of the generated ions into circular orbits in planes perpendicular to the magnetic field direction. The movement of the ions in a direction parallel to the direction of the magnetic field is confined by an electric field produced by the bias voltage applied to electrode plates 23 and 26 which are orthogonal to that direction. If positive ions are being analyzed, a positive bias is applied to electrode plates 23 and 26, whereas a negative bias potential is applied to confine negative ions. In this ion trapping stage of operation, the other four electrode plates 21, 22, 24 and 25 are at an averaged ground potential.

The ions within the cell 16 oscillate in several modes. In order to measure the ions' mass-to-charge ratio, the ions must be excited at step 66 to oscillate in the cyclotron mode at higher kinetic energy. The excitation is generated by excitation circuit 42 which responds to a command from the computer 40 by applying a time-varying excitation potential across opposed electrode plates 21 and 24 which are in planes parallel to the magnetic field direction. The time-varying potential has frequency components encompassing all the cyclotron mode resonant frequencies $\omega_c$ of the ions to be analyzed. The excitation potential is applied for a given interval and produces a radio frequency electric field within the cell 16 orthogonal to the magnetic field.

After the excitation interval, the ions are oscillating with significant energy at their respective cyclotron frequencies. As a result of the excited ion oscillations, a measurable alternating voltage signal will be produced across electrode plates 22 and 25 which are in planes parallel to the magnetic field direction. The alternating voltage signal across electrode plates 22 and 25 is detected at step 68 by a signal receiver 44 following the excitation interval. The signal received from the cell 16 is a superposition of a plurality of distinct frequency signals, each one being produced by excited ions with unique mass-to-charge ratios. The amplitude of each component signal is proportional to the number of ions having the corresponding mass-to-charge ratio.

The output of signal receiver 44 is coupled to a fast analog-to-digital converter (ADC) 48 to produce a series of digital samples taken at a rate which is at least twice the highest frequency in the received signal. The digital samples of the signal received from the cell are stored in memory 49 for subsequent analysis.

In order to be able to minimize artifacts in the analysis results, several data acquisition iterations may be carried out to store several sets of data. To do so, between each iteration the trapping cell 16 is purged of all ions at step 70. This can be accomplished either by applying a large potential to either electrode plate 23 or 26 or by inverting the potential on both those electrode plates to eliminate the trapped ions. Thereafter, the sequence of ion generation, excitation and resonant frequency detection (steps 64–68) is repeated. The data samples from several iterations can be averaged prior to analysis or analyzed individually with the analysis results being averaged to remove the effects of noise.

One of the novel aspects of the present invention is the technique by which the received ion cyclotron resonance signal data in the time domain is transformed into the frequency domain. This technique involves linear prediction using a least-squares process that fits the stored data samples into a mathematical model of the received signal. The stored samples were taken by the ADC 48 at N regular times given by $n\Delta t$, where n is a positive integer between zero and N−1. For example, 512 data samples (N=512) can be taken and stored for a sample having six groups of ions with unique mass-to-charge ratios. The received signal produced across electrode plates 22 and 25 decays exponentially as the excited ions return to their lower steady-state energy levels and orbits. Furthermore the received signal is the sum of K exponentially damped sinusoidal signals, where K is the number of unique mass-to-charge ion groups, plus a noise component. Therefore, the signal f(x) received from the ion cyclotron resonant cell 16 is represented by the mathematical model:

$$f(x) = x(n\Delta t) = \sum_{k=1}^{K} C_k e^{-b_k n \Delta t} \cos(\omega_k n \Delta t + \phi_k) + W_n \quad (2)$$

where $C_k$ is the initial magnitude of the signal, $-b_k$ is the decay parameter, $\omega_k n \Delta t$ is the resonant frequency ($\omega_c$) of the signal from one mass-to-charge ion group, $\phi_k$ is the signal phase angle, and $W_n$ is the noise component. Therefore each component frequency is defined by four spectral parameters, namely $\omega_k$, $b_k$, $C_k$, and $\phi_k$ thereby involving 4 K spectral parameters to define the composite received signal.

The principle of linear prediction can be applied to reduce the number of parameters required to define the composite signal and correspondingly each component signal. According to this principle each data sample $x_n$ of the received signal (where n is the number of the sample in the sampling series) can expressed as a linear combination of M previous data samples ($x_{n-M}$ through $x_{n-1}$) according to the function:

$$x_n = a_1 x_{n-1} + a_2 x_{n-2} + \ldots + a_M x_{n-M} \quad (3)$$

in which the linear prediction coefficients $a_1$ through $a_M$ are independent of n. The number of previous samples M can be 0.5 N to 0.75 N where N is the number of signal samples taken. The linear prediction principle allows a composite signal formed by the superposition of K component signals to be defined by 2 K coefficients. However, in practice, a larger number of terms (coefficients) are required when the signal contains noise.

The linear prediction coefficients ($a_1 - a_M$) are determined for the desired order M using the stored data samples. The 4 K spectral parameters of equation (2) for the K ion cyclotron resonant frequencies can be calculated from the linear prediction coefficients by a two-stage least-squares fit technique. Future data samples, i.e. those occurring after the sampling period, can be predicted using equation (3). From a relatively small number of signal samples an arbitrarily long time-domain signal can be generated to which a Fourier transformation can be applied, as an alternative signal analysis technique to the present method.

The linear prediction coefficients $a_1 - a_m$ are obtained by constructing a data matrix equation which the Computer 40 solves by matrix algebra. Equation (3) can be written for each of N-M known data samples with the resulting set of equations being represented by:

$$X\bar{a} = \bar{x} \quad (4)$$

in which X is a rectangular matrix of the M previous data samples for each of the N-M equations thereby having dimensions M by N-M. The term $\bar{a}$ is a one-dimensional array of the coefficients $a_1 - a_M$ and $\bar{x}$ is a one-dimensional array of N-M data samples represented by each equation. Thus, arrays X and $\bar{x}$ are known while $\bar{a}$ is to be determined. The matrices of known data are set up in computer 40 at step 72.

Equation (4) is solved by a linear least-squares procedure such as is described by C. L. Lawson and R. J. Hanson, *Solving Least Squares Problems*, Prentice-Hall, Englewood Cliffs, N.J. 1974. In doing so, matrix X is decomposed according to:

$$X = U \Lambda \tilde{V} \quad (5)$$

in which $\Lambda$ is a diagonal matrix of the same dimensions as X. The diagonal entries of $\Lambda$ are the so-called singular values of X which are equal to the square roots of the eigenvalues of the non-negative definite matrix $X\tilde{X}$ ($\tilde{X}$ denotes transposition) in descending order. The matrices U and V are orthogonal matrices that reduce $X\tilde{X}$ and $\tilde{X}X$, respectively, to diagonal form. These matrices are calculated by computer 40 at step 74. For a data matrix of a signal comprising K noiseless exponentially damped sinusoids, matrix $\Lambda$ has 2 K singular values which are are non-zero and the remaining values are equal to zero. When noise is present, the remaining values become non-zero. However if the signal-to-noise ratio is reasonably good, the singular values related to the noise will have extremely small magnitude, several orders of magnitude smaller than the values from the ion resonance signals. The signal related eigenvalues for $X\tilde{X}$ also can be improved by subtracting from each one the arithmetic mean of the noise related eigenvalues.

From this point, the values for the linear prediction coefficients $a_1 - a_M$ of equation (3) are obtained at step 76 by computer 40 solving the expression:

$$\bar{a} = V \tilde{\Lambda}^{-1} \tilde{U} \bar{x} \quad (6)$$

where the inverse rectangular matrix $\tilde{\Lambda}^{-1}$ is an M by N-M dimensional diagonal matrix with diagonal entries such that:

$$\tilde{A}\Lambda^{-1} = \begin{vmatrix} E_{2K} & 0 \\ 0 & 0 \end{vmatrix} \quad (7)$$

where $E_{2K}$ is the unit matrix of dimension 2 K. The solution to equation (3) is simplified by substituting the following expression for V:

$$V = \tilde{XU}\Lambda^{-1} \quad (8)$$

Once the linear prediction coefficients $a_1 - a_M$ have been found, the spectral parameters of equation (2) for each component frequency signal must be calculated. For N signal samples where $N > 2K$, the parameters for the resonant frequency $\omega_c$ and the damping factor $b_k$ can be derived by taking the roots of the polynomial:

$$z^M - a_1 z^{M-1} - \ldots - a_M = 0 \quad (9)$$

Of the M roots only the 2 K largest ones are retained. The roots lying on the real axis each correspond to a damped exponential function with zero frequency and cumulatively form the background signal on which the ion resonant signals are superimposed. The retained roots can be divided into two groups which are each other's complex conjugate. Each conjugate pair of roots represents one of the K exponentially damped sinusoidal signals from the oscillating ions. By depicting a root as a vector in the complex plane, the signal damping factor $b_k$ for equation (2) can be obtained from the radius and the resonant frequency $\omega_c$ from the angle with the real axis.

Once the frequencies $\omega_c$ and the damping factors $b_k$ for each resonant signal have been determined, the parameters for amplitude $C_k$ and the phase $\phi_k$ remain to be found at step 80. By substituting each frequency and damping factor pair of parameters into equation (2), a series of equations can be written in which each equation represents the signal from one mass-to-charge ratio group of ions. The amplitude and phase parameters can be determined from this series of equations by another linear least-squares procedure.

The result of the linear prediction process is a table of the four parameters for the component signals from each group of ions with a unique mass-to-charge ratio. This data can be used directly as the frequency identifies the group of ions and the amplitude provides the relative number of ions in each group within the gas sample. The linear prediction technique enabled these data to be derived with significantly fewer signal samples than are required by Fourier transformation to attain the same degree of signal frequency resolution.

Figure 3:
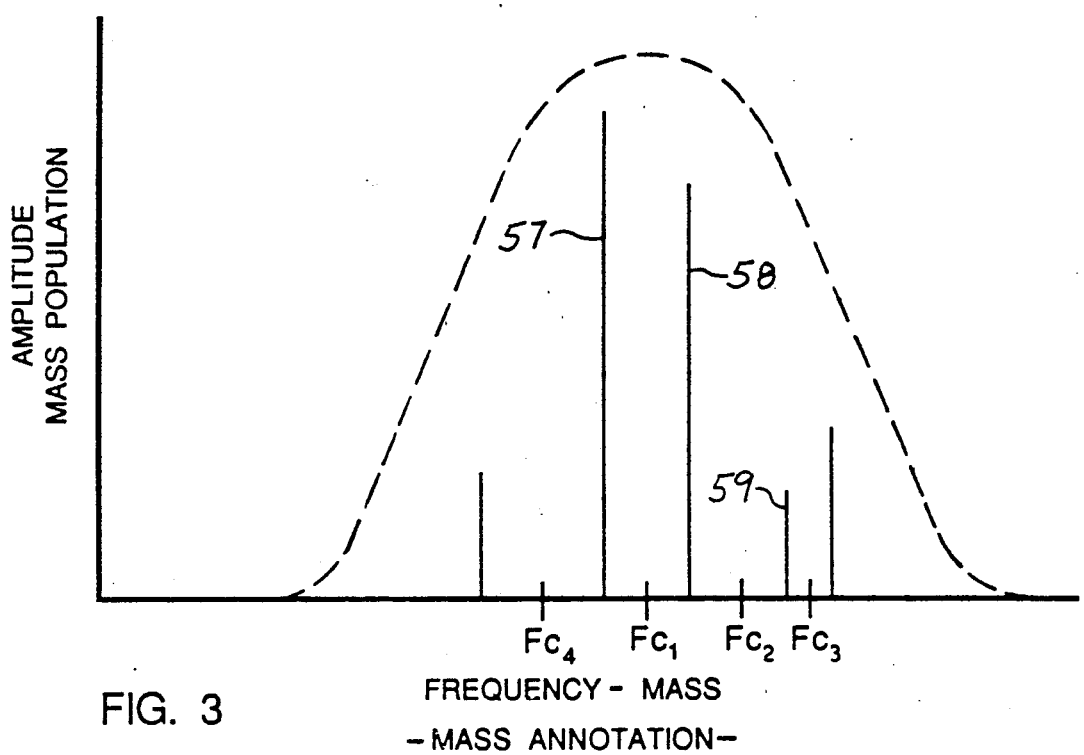
FIG. 3 is a plot of exemplary resultant data from spectrometry using the illustrated apparatus.

Alternatively the frequency and amplitude coefficients can be plotted at step 82 to provide a mass/frequency spectrum graph similar to the one illustrated in FIG. 3. In this spectrum each unique mass-to-charge ratio ion group is represented by a separate vertical line with the height of the line corresponding to the population of that group of ions in the sample being analyzed.

The technique described above excites the ions to oscillate at higher energy levels by applying a time-varying electric field across the cell 16. For example, the frequency of a sinusoidally varying electric field can vary linearly during the excitation interval. The frequency components of the electric field are chosen to encompass all of the resonant frequencies of the ions expected to the present in the sample being analyzed.

An alternative excitation technique can be used where the resonant frequencies of the ions in the sample are known already. This latter embodiment of the present invention is especially useful where different ions have very similar mass-to-charge ratios, and therefore resonate at closely spaced apart frequencies.

With reference to FIG. 3, frequency $Fc_1$ is the center frequency between the two spectral lines 57 and 58 with the largest amplitude. Instead of exciting the ions with a broad band frequency pulse, the excitation signal comprises a sinc pulse, i.e. (sin x)/x, at frequency $Fc_1$ produced by a frequency generator 46. This radio frequency pulse produces excitation energy in an narrow band of frequencies depicted by the dashed line in FIG. 3. As spectral lines 57 and 58 are at equal offset frequencies from the excitation frequency $Fc_1$, the ions having the corresponding resonant frequencies will receive the same level of excitation energy. However, ions with the other resonant frequencies will receive less energy as denoted by the dashed energy distribution curve.

Figure 4:
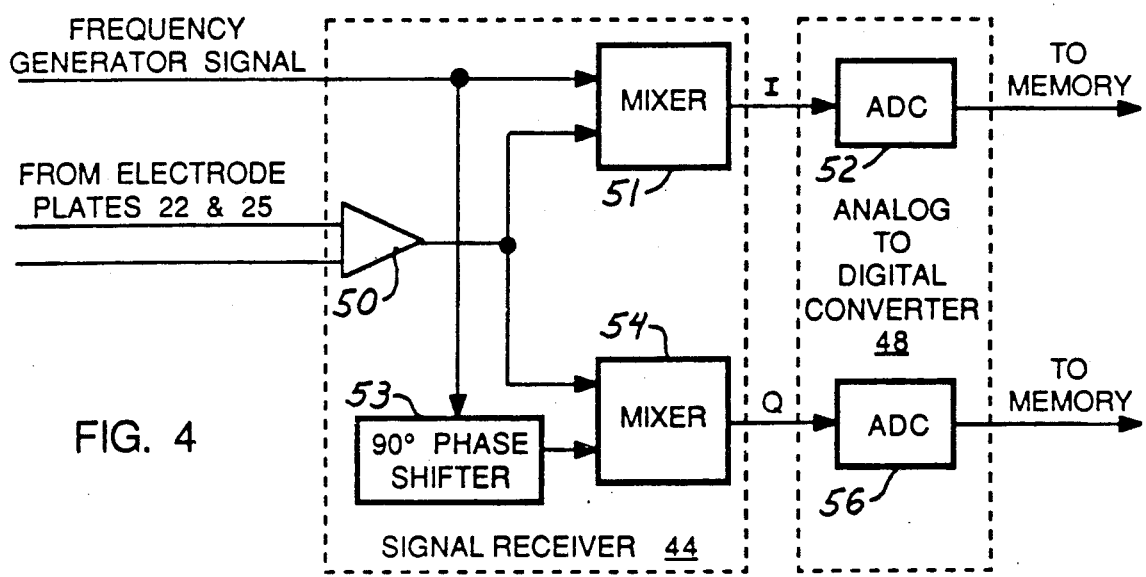
FIG. 4 is a schematic diagram of a circuit for processing the signal from excited ions within the cell.

Following the excitation stage, the signal produced by the ions across electrode plates 22 and 25 is detected by the signal receiver 44. For this alternative method, signal receiver 44 incorporates a coherent quadrature heterodyne detection circuit shown in FIG. 4. As this variation of the present invention excites the ions which resonate in a relatively small range of frequencies about $Fc_1$, a narrow bandwidth tunable preamplifier 50 may be utilized at the signal input of the receiver. The signal receiver 44 mixes the signal from the frequency generator 46 with the preamplified signal received from electrode plates 22 and 25 of cell 16. The frequency generator signal has the same phase and frequency $Fc_1$ as the signal which was used to excite the ions. A first mixer 51 heterodynes the signal received from electrode plates 22 and 25 with the frequency generator signal to produce a signal, designated I, representing the components of the received signal that are in phase with the excitation signal. The I signal is digitized by a first ADC 52 which is part of converter 48 in FIG. 1. The digitized signal samples are sent to memory 49 as a set of "real" signal samples.

A phase shifter 53 shifts the signal from the frequency generator signal by 90° and applies the phase shifted signal to an input of a second mixer 54. The second mixer 54 heterodynes the received signal from preamplifier 50 with the phase shifted signal to produce a quadrature signal Q representing the components of the received signal that are 90° out of phase with the excitation signal. The Q signal is digitized by a second ADC 56 which is part of converter 48. The digitized signal samples are sent to memory 49 as a set of "imaginary" signal samples. The two sets of data samples from the I and Q signals form complex quadrature data representing the received signal in the time domain. From these data, information can be extracted regarding the frequency and phase of the component signals produced by the ion oscillation.

The complex quadrature time domain data is transformed into the frequency domain by linear prediction using a least-squares procedure similar to the method previously described. This transformation yields the coefficients of equation (2) for the signals at the resonant frequencies depicted by lines 57 and 58 in FIG. 3.

The process then is repeated using other excitation frequencies $Fc_2$, $Fc_3$, and $Fc_4$ to derive the equation (2) coefficients for each ion resonant frequency. For example, when excitation frequency $Fc_2$ is employed, the ions at the resonant frequencies depicted by the spectral lines 58 and 59 will receive equal excitation energy. As a result these ions will be excited to an energy level which will induce signal across electrode plate 22 and 25. The signal received from the electrode plates is processed as described above to derive the information about this pair of component resonant frequency signals. The solution of the second signal transformation is somewhat simplified as the coefficients for spectral line 58 were previously derived. Therefore, on the second transformation iteration, only the signal coefficients for spectral line 59 are unknown.

We claim:

1. An ion cyclotron resonance mass spectrometer comprising:
   a closed chamber for receiving a gaseous sample to be analyzed;
   an ion trapping cell formed by a plurality of electrode plates within said chamber;
   means for producing K groups of ions within said ion trapping cell, where K is a positive integer and each group being defined by a different ion mass-to-charge ratio;
   means for generating a magnetic field along a given direction through said ion trapping cell to cause the ions to orbit at angular frequencies dependent on the mass-to-charge ratio of individual ions;
   means for producing a static electric field within said ion trapping cell which in conjunction with the magnetic field confines within said ion trapping cell substantially all ions of a given charge polarity that are formed by said means for producing ions;
   means for creating a time-varying electric field within said ion trapping cell and orthogonal to the given direction of the magnetic field, to excite ions having mass-to-change ratios within a predetermined range;
   means for detecting a time domain electrical signal produced in said ion trapping cell by the orbiting excited ions;
   means for sampling the electrical signal detected by said means for detecting to produce N digital samples of that signal during a sampling period which is less than $1/\Delta f$, where $\Delta f$ is the smallest separation between resonant frequencies of the ions; and
   means for transforming the samples of the time domain electrical signal into a frequency domain signal data by linear prediction using a linear least-squares procedure, the resultant frequency domain signal data comprising K coefficients $a_1 - a_K$ in which each coefficient represents the abundance of excited ions in one of the K groups of ions having a different mass-to-charge ratio.

2. The ion cyclotron resonance mass spectrometer as recited in claim 1 wherein said means for creating a time-varying electric field comprises a radio frequency signal generator coupled to said ion trapping cell for creating a pulsed electric field in a broad band of frequencies which includes the cyclotron resonant frequencies of the orbiting ions.

3. The ion cyclotron resonance mass spectrometer as recited in claim 1 wherein said means for producing a static electric field includes a source of a voltage potential and means for applying the voltage potential to the electrode plates of said ion trapping cell, the voltage potential being of a magnitude and a polarity to confine the ions of a given charge polarity.

4. The ion cyclotron resonance mass spectrometer as recited in claim 1 wherein said means for creating a time-varying electric field comprises a signal generator for producing an oscillating signal only in a range of frequencies that is between adjacent cyclotron resonant frequencies of ions with two different mass-to-charge ratios; and means for applying a pulse of the oscillating signal across two electrode plates.

5. The ion cyclotron resonance mass spectrometer as recited in claim 4 wherein said means for detecting includes a narrow band receiver tuned to receive the time domain electrical signal induced in said ion trapping cell by the orbiting excited ions with the two different mass-to-charge ratios.

6. The ion cyclotron resonance mass spectrometer as recited in claim 4 wherein the frequency of the oscillating signal applied by said signal generator is substantially midway between cyclotron resonant frequencies of ions with two different mass-to-charge ratios.

7. The ion cyclotron resonance mass spectrometer as recited in claim 4 wherein said means for detecting comprises:
   means for sensing an electric signal induced between two of the electrode plates by the orbiting ions;
   a first means for mixing the electric signal from said means for sensing with a signal having the same phase and frequency as the oscillating signal from said signal generator to produce a first resultant signal; and
   a second means for mixing the electric signal from said means for sensing with a signal having the same frequency as, but ninety degrees out of phase with, the oscillating signal from said signal generator to produce a second resultant signal.

8. The ion cyclotron resonance mass spectrometer as recited in claim 7 wherein:
   said means for sampling produces samples of both the first and second resultant signals; and
   said means for transforming the samples uses the samples of both the first and second resultant signals to transform the time domain electrical signal into frequency domain signal data.

9. The ion cyclotron resonance mass spectrometer as recited in claim 7 wherein the number N of samples produced by said means for sampling is equal to or greater than twice the number of groups of ions which have different mass-to-charge ratios.

10. An ion cyclotron resonance mass spectrometry method comprising:
    ionizing a material sample within an ion trapping cell located in an evacuatable chamber to produce K groups of ions with each group being defined by a different ion mass-to-charge ratio, and where K is a positive integer;
    during and after the ionizing step, confining ions within the cell and causing the ions to orbit at an angular frequency by subjecting them to a static magnetic field along a first direction and a static electric field along a second direction orthogonal to the first direction;
    creating a time-varying electric field within said ion trapping cell orthogonal to the first direction, which excites ions having mass-to-charge ratios within a predetermined range;
    producing a time domain electrical signal from and representative of the orbiting motion of the excited ions;

periodically sampling the time domain electrical signal to produce N signal samples, during a sampling period which is less than $1/\Delta f$, where $\Delta f$ is the smallest separation between resonant frequencies of the ions; and transforming the signal samples of the time domain electrical signal into K coefficients $a_1 - a_K$ by linear prediction using a linear least-squares procedure, each coefficient represents the abundance of excited ions in one of the K groups of ions.

11. The ion cyclotron resonance mass spectrometry method as recited in claim 10 wherein the number N of signal samples produced by sampling the time domain electrical signal is equal to or greater than twice the number of groups of ions with different charge-to-mass ratios.

12. The ion cyclotron resonance mass spectrometry method as recited in claim 11 in which N-M of the signal samples $x_n$ each can be represented by a linear combination of M previous signal samples ($x_{n-M}$ through $x_{n-1}$) according to the equation $x_n = a_1 x_{n-1} + a_2 x_{n-2} + \ldots + a_M x_{n-M}$, where n is the number of the signal sample in a series of samples and $a_1$ through $a_M$ are linear prediction coefficients, thereby producing a series of equations for the N-M signal samples; and wherein said transforming step comprises:

defining the series of equations as a matrix equation $\bar{X} \bar{a} = \bar{s}$, where $\bar{X}$ is a rectangular matrix of the M previous signal samples for each of the N-M equations and having dimensions M by N-M, $\bar{a}$ is a one-dimensional array of the linear prediction coefficients $a_1 - a_M$, and $\bar{x}$ is a one dimensional array of N-M signal samples $x_n$ represented by each equation;

solving the matrix equation for the linear prediction coefficients $a_1$ through $a_M$;

computing the roots of the polynomial expression: $z^M - a_1 z^{M-1} - \ldots - a_M = 0$, where $a_1$ through $a_M$ are the linear prediction coefficients obtained in the previous step; and from the complex roots deriving the frequency of excited ions of each different mass-to-charge ratio, without producing another time domain electrical signal.

13. The ion cyclotron resonance mass spectrometry method as recited in claim 10 further comprising the step of plotting a representation of the resultant frequency domain data as a two dimensional graph of frequency versus signal amplitude.

14. The ion cyclotron resonance mass spectrometry method as recited in claim 10 further comprising the step employing the resultant frequency domain data to derive information about the mass of each type of ion present in the cell and the number of ions with each mass, without producing another time domain electrical signal.

15. The ion cyclotron resonance mass spectrometry method as recited in claim 10 wherein the step of creating a time-varying electric field comprises generating an oscillating signal only in a range of frequencies that is between adjacent cyclotron resonant frequencies of ions with two different mass-to-charge ratios; and applying a pulse of the oscillating signal across two electrodes on opposite sides of the ion trapping cell.

16. The ion cyclotron resonance mass spectrometry method as recited in claim 15 wherein the step of producing a time domain electrical signal includes:

mixing the time domain electric signal with a signal having the same phase and frequency as the time-varying electric field to produce a first resultant time domain electrical signal; and mixing the time domain electric signal with a signal having the same frequency as, but ninety degrees out of phase with, the time-varying electric field to produce a second resultant time domain electrical signal.

17. The ion cyclotron resonance mass spectrometry method as recited in claim 16 wherein the sampling step produces N samples of both the first and second resultant time domain electrical signals; and the transforming step uses the samples of both the first and second resultant time domain electrical signals to produce a frequency domain data.

18. An ion cyclotron resonance mass spectrometry method comprising:

a) ionizing a material sample within an ion trapping cell located in an evacuatable chamber;

b) during and after the ionizing step, confining ions within the cell and causing the ions to orbit at an angular frequency by subjecting them to a static magnetic field along first direction and a static electric field along a second direction orthogonal to the first direction;

c) creating an alternating electric field within said ion trapping cell orthogonal to the first direction for a given period of time by applying a pulse of an oscillating signal having a frequency which is between the cyclotron resonant frequencies of two groups of ions which have different mass-to-charge ratios;

d) after the given period of time, producing a time domain electrical signal from and representative of the orbiting motion of the excited ions;

e) digitizing the time domain electrical signal to produce N digital samples of that signal during a sampling period which is less than $1\Delta f$, where $\Delta f$ is the separation between the cyclotron resonant frequencies of the two groups of ions; and f) transforming the digital samples of the time domain electrical signal into a frequency domain signal by linear prediction using a linear least-squares procedure, the resultant frequency domain signal containing information about the amplitude and frequency of a signal emitted by excited ions of each different mass-to-charge ratio in aid ion trapping cell; and g) repeating steps c) through f) for other groups of ions which have different mass-to-charge ratios.

* * * * *

UNITED STATES PATENT AND TRADEMARK OFFICE
CERTIFICATE OF CORRECTION

PATENT NO. : 5,047,636

DATED : September 10, 1991

INVENTOR(S) : Thomas C. Farrar et al.

It is certified that error appears in the above-identified patent and that said Letters Patent is hereby corrected as shown below:

In claim 12, column 11, lines 27 and 28, change "$X\ \bar{a} = \bar{s}$" to --$X\ \bar{a} = \bar{x}$--.

In claim 18, column 12, line 56, change "aid" to --said--.

Signed and Sealed this

Twenty-third Day of February, 1993

*Attest:*

STEPHEN G. KUNIN

*Attesting Officer*     *Acting Commissioner of Patents and Trademarks*